(12) United States Patent
Shepard et al.

(10) Patent No.: US 8,179,717 B2
(45) Date of Patent: May 15, 2012

(54) MAINTAINING INTEGRITY OF PRELOADED CONTENT IN NON-VOLATILE MEMORY DURING SURFACE MOUNTING

(75) Inventors: Zac Shepard, San Jose, CA (US);
Xiaoyu Yang, Campbell, CA (US);
Albert Meeks, Sunnyvale, CA (US);
Qing Li, San Jose, CA (US); Enosh Levi, Sunnyvale, CA (US); Kim Le, San Jose, CA (US); Raz Dan, San Jose, CA (US); Brian Murphy, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 388 days.

(21) Appl. No.: 12/569,869

(22) Filed: Sep. 29, 2009

(65) Prior Publication Data

US 2011/0075482 A1    Mar. 31, 2011

(51) Int. Cl.
*G11C 11/34* (2006.01)
*G11C 16/04* (2006.01)
(52) U.S. Cl. ............ 365/185.02; 365/185.09; 438/106
(58) Field of Classification Search .......... 438/106; 365/185.01–185.33, 201
See application file for complete search history.

(56) References Cited

U.S. PATENT DOCUMENTS

| | | | |
|---|---|---|---|
| 6,553,510 B1 * | 4/2003 | Pekny | 714/6.12 |
| 6,642,113 B1 * | 11/2003 | Kuo et al. | 438/275 |
| 6,819,608 B2 * | 11/2004 | Watanabe | 365/200 |
| 7,015,065 B2 | 3/2006 | Tsai | |
| 7,609,561 B2 * | 10/2009 | Cornwell et al. | 365/185.33 |
| 2008/0298128 A1 * | 12/2008 | Kang et al. | 365/185.18 |

OTHER PUBLICATIONS

Chip Scale Package (CSP), www.siliconfareast.com/csp.htm, 2004.
Chip Scale Package (CSP), p. 2, www.siliconfareast.com/csp2.htm, 2004.
Die Stacking, www.siliconfareast.com/diestacking.htm, 2005.
Die Stacking, p. 2, www.siliconfareast.com/diestacking2.htm, 2005.
Solder Reflow, www.siliconfareast.com/solder-reflow.htm, 2005.
Reflow Soldering, Adrio Communications Ltd., http://www.radio-electronics.com/info/manufacture/soldering/reflow_soldering/infrared_reflow_soldering.php, printed Sep. 29, 2009.

* cited by examiner

*Primary Examiner* — Tuan T Nguyen
*Assistant Examiner* — Lance Reidlinger
(74) *Attorney, Agent, or Firm* — Vierra Magen Marcus & DeNiro LLP

(57) ABSTRACT

A non-volatile memory chip package is prepared for surface mounting to a substrate in a solder reflow process by programming erased blocks to higher threshold voltage levels, to improve data retention for blocks which are preloaded with content, such as by an electronic device manufacturer. Following the surface mounting, the previously-erased blocks are returned to the erased state. The threshold voltage of storage elements of the preloaded blocks can change during the surface mounting process due to a global charge effect phenomenon. The effect is most prominent for higher state storage elements which are surrounded by erased blocks, in a chip for which the wafer backside was thinned and polished. The erased blocks can be programmed using a single program pulse without performing a verify operation, as a wide threshold voltage distribution is acceptable.

18 Claims, 11 Drawing Sheets

MAINTAINING INTEGRITY OF PRELOADED CONTENT IN NON-VOLATILE MEMORY DURING SURFACE MOUNTING

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Typically, a program voltage Vpgm applied to the control gate during a program operation is applied as a series of pulses that increase in magnitude over time. The program voltage can be applied to a selected word line. In the periods between the program pulses, verify operations are carried out. That is, the programming level of each element of a group of storage elements being programmed in parallel is read between successive program pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

However, one issue which continues to be problematic is data retention. The threshold voltages of storage elements which are programmed to respective target data states can subsequently change for various reasons. As a result, the data which is stored can become corrupted so that it cannot be accurately read back.

DETAILED DESCRIPTION

A method and non-volatile storage system are provided in which the integrity of data which is preloaded into a non-volatile memory chip is maintained during a surface mounting process of the chip to a substrate.

It has been found that data retention in a non-volatile storage device is impacted by a surface mounting process in which the non-volatile storage device is mounted to a substrate such as a printed circuit board (PCB). Specifically, some blocks of the non-volatile storage device are commonly preloaded with data prior to the surface mounting process, while other blocks remain in an erased state. The threshold voltage of programmed storage elements can change during the surface mounting process and, in particular, during a solder reflow process in which heat is applied to the non-volatile storage device to solder it to the substrate. By temporarily programming the erased blocks to a higher state, in preparation for the surface mounting process, data retention is significantly improved. The temporarily programmed blocks are returned to the erased state following the surface mounting process, so that these blocks are available for use by an end user.

The techniques provided herein are suitable for use with non-volatile memory such as NAND flash memory, which connects multiple transistors in series between two select gates, in a NAND string.

Figure 1:
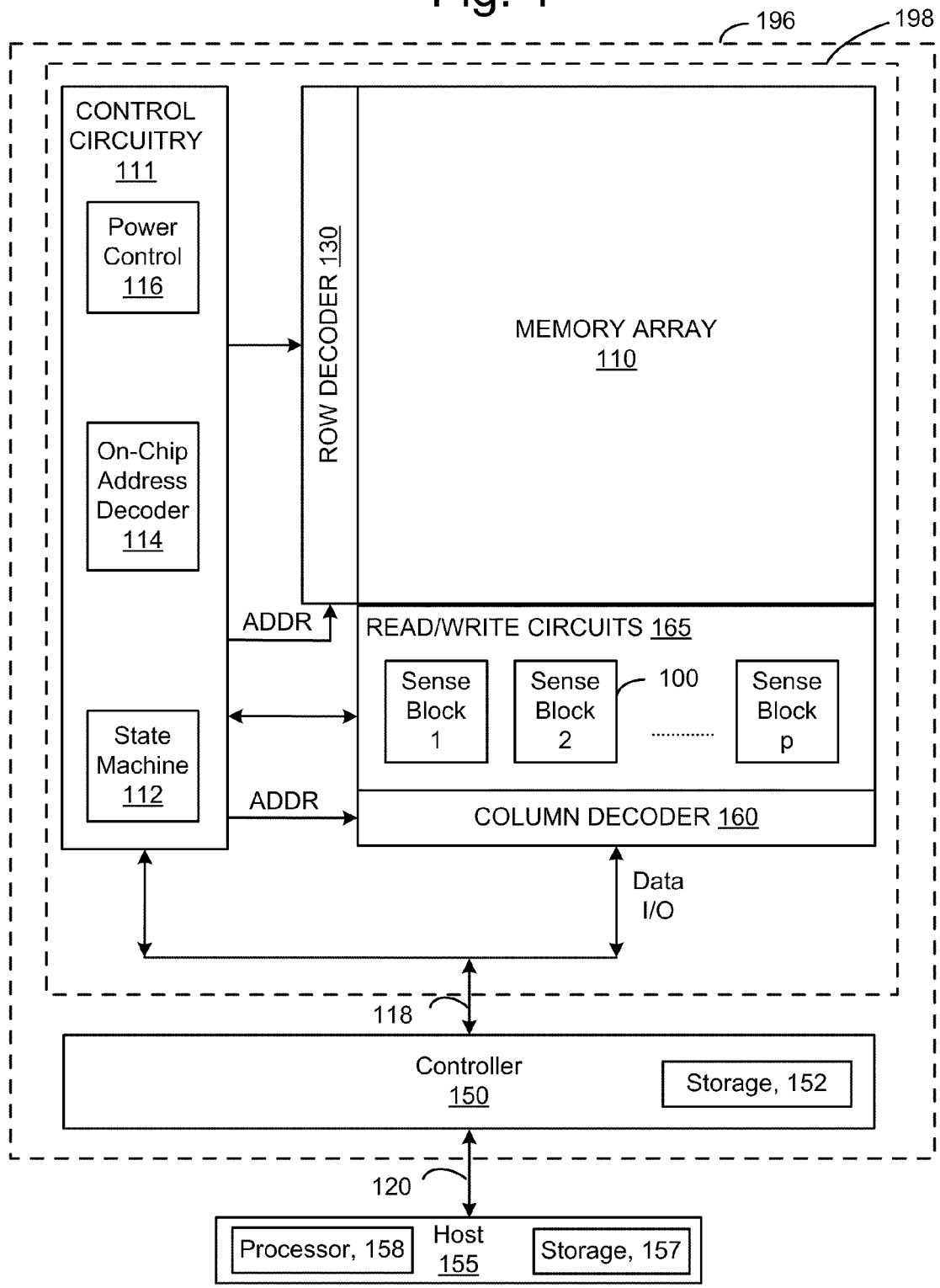
FIG. 1 is a block diagram of a non-volatile memory system using single row/column decoders and read/write circuits.

FIG. 1 is a block diagram of a non-volatile memory system using single row/column decoders and read/write circuits. The diagram illustrates a memory device 196 having read/write circuits for reading and programming a page of storage elements in parallel, according to one embodiment. Memory device 196 may include one or more memory die 198. Memory die 198 includes a two-dimensional array of storage elements 110, control circuitry 110, and read/write circuits 165. In some embodiments, the array of storage elements can be three dimensional. The memory array 110 is addressable by word lines via a row decoder 130 and by bit lines via a column decoder 160. The read/write circuits 165 include multiple sense blocks 100 and allow a page of storage elements to be read or programmed in parallel. Typically a controller 150 is included in the same memory device 196 (e.g., a removable storage card) as the one or more memory die 198. Commands and Data are transferred between the host 155 and controller 150 via lines 120 and between the controller and the one or more memory die 198 via lines 118.

The host 155 can be a controller of an electronic device, such as a cell phone or camera, in which the die 198 is installed, or of test equipment which is used during the surface mounting process, for instance.

The control circuitry 111 cooperates with the read/write circuits 165 to perform memory operations on the memory array 110. The control circuitry 110 includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations.

In some implementations, some of the components of FIG. 1 can be combined. In various designs, one or more of the components (alone or in combination), other than storage element array 110, can be thought of as a managing or control circuit. For example, one or more managing or control circuits may include any one of or a combination of control circuitry 110, state machine 112, decoders 114/160, power control 116, sense blocks 100, read/write circuits 165, controller 150, etc.

The controller 150 may include a storage location 152 which stores code which is executed to perform the functionality for preparing a non-volatile memory chip package for surface mounting to a substrate, as described herein. The storage location 152 may be considered to be an example of at least one processor readable storage device which has processor readable code embodied thereon for programming one or more processors, such as controller 150, to perform a computer implemented method for surface mounting a non-volatile memory chip package to a substrate as described herein. Alternatively, or additionally, the host 155 and/or control circuitry 111 may have a non-volatile storage location which stores code which is executed to perform the functionality described herein. For example, the host 155 may have a storage location 157 which stores code which is executed by a processor 158.

In another embodiment, a non-volatile memory system uses dual row/column decoders and read/write circuits. Access to the memory array 110 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 110. In this way, the density of the read/write modules is essentially reduced by one half.

In other possible embodiments, discussed further below, multiple die are arranged in a stacked manner in a common package. Typically, one controller such as controller 150 is provided for the set of die.

Figure 2:
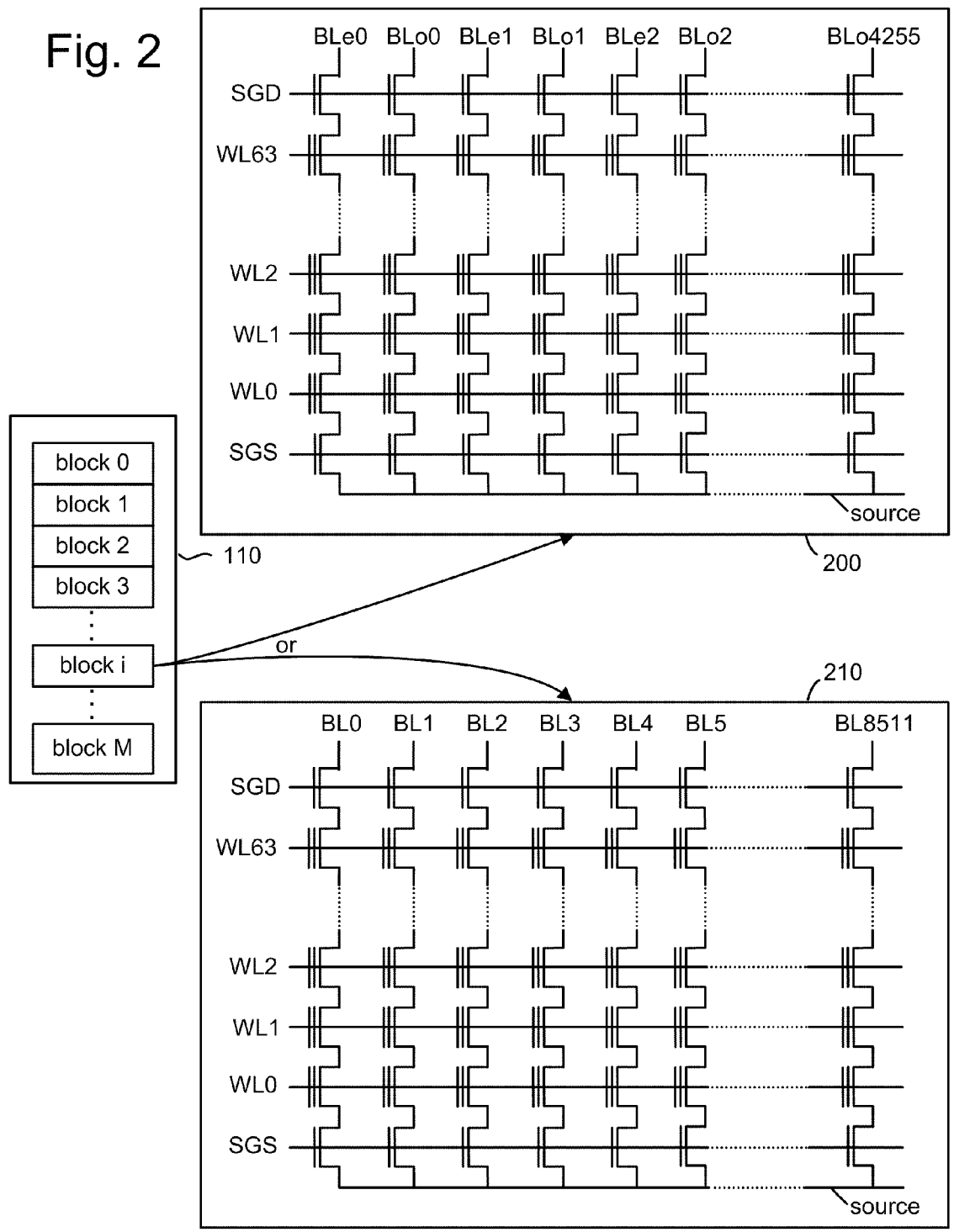
FIG. 2 illustrates an example of an organization of a memory array into blocks for an all bit line memory architecture or for an odd-even memory architecture.

FIG. 2 illustrates an example of an organization of a memory array 110 into blocks 0-M for an all bit line memory architecture or for an odd-even memory architecture. Exemplary structures of memory array 110 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 210), all the bit lines of a block can be simultaneously selected during read and program operations. Storage elements along a common word line and connected to any bit line can be programmed at the same time.

In the example provided, storage elements are connected in series to form a NAND string. One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 200), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. In each block, in this example, there are 8,512 columns that are divided into even columns and odd columns, and sixty-four storage elements are shown connected in series in a column to form a NAND string.

During one configuration of read and program operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the Vth of the storage elements becomes negative.

Figure 3A:
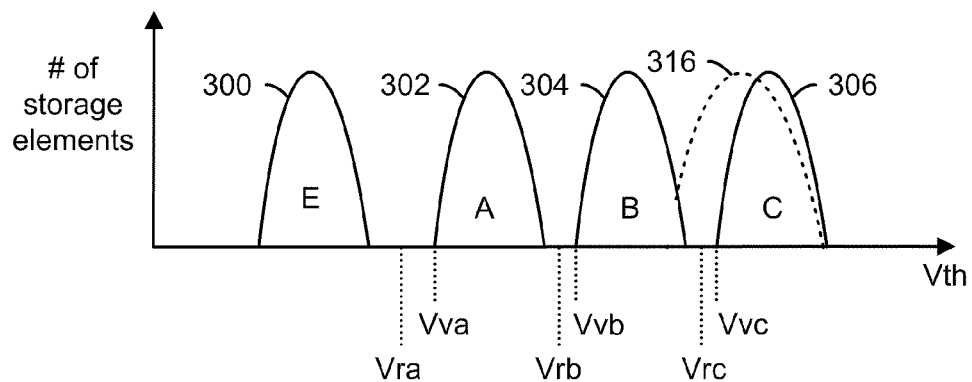
FIG. 3*a* depicts an example set of threshold voltage distributions for a set of four-state blocks of storage elements surrounded by erased blocks of storage elements in the pattern of FIG. 3*b*.
Figure 3B:
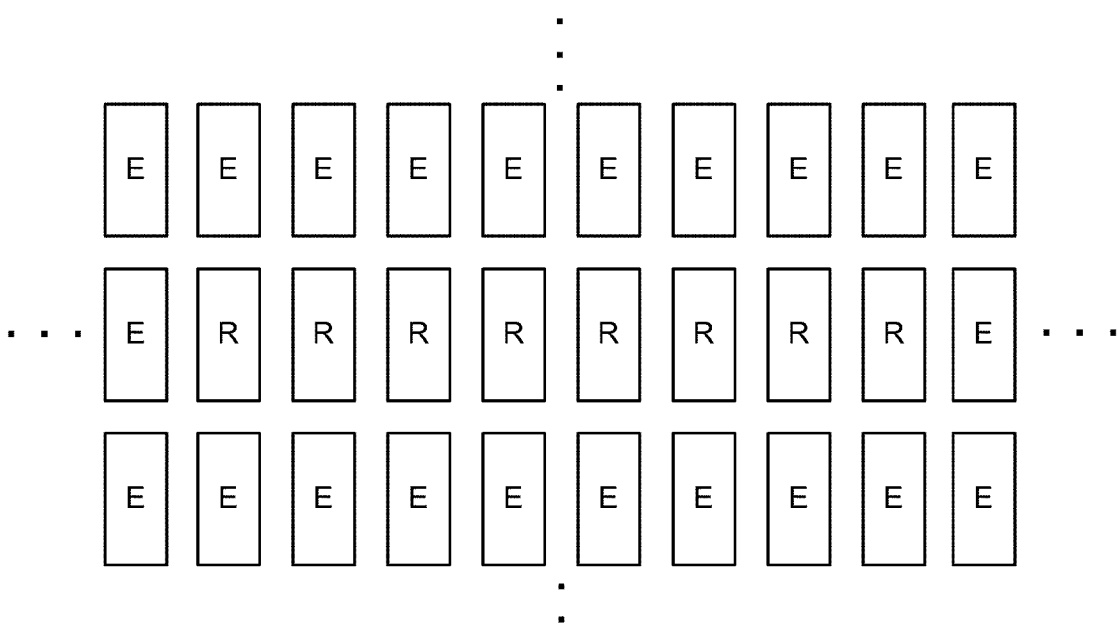
FIG. 3*b* depicts a pattern of randomly (R) programmed blocks surround by erased (E) state blocks.

FIG. 3a depicts an example set of threshold voltage distributions for a set of four-state blocks of storage elements surrounded by erased blocks of storage elements in the pattern of FIG. 3b. The x-axis denotes threshold voltage and the y-axis denotes a number of storage elements. A four-state or four-level memory device may store two bits of data per state in four data states referred to as an erased or E state, represented by distribution 300, and programmed states A, B and C, represented by distributions 302, 304 and 306, respectively. It has been found that data retention of higher data states, such as the C state, which is the highest programmed state in a four-state device, is sensitive to the data pattern inside a memory device during the high temperatures seen during the surface mount process. For example, the C state distribution 306 can transition to a representative widened distribution 316 which falls below the read reference voltage Vrc, thereby corrupting some of the C state data, based on the data states of surrounding blocks. In practice, different degrees of shifting are seen for different programmed blocks.

The distribution represents eight blocks with a random pattern which were surrounded by 248 erased state blocks. A randomly programmed block, in this example, includes storage elements which are randomly programmed to the A, B, or C state, and is meant to represent preloaded content/data in the memory device. FIG. 3b depicts a pattern of randomly (R) programmed blocks surround by erased (E) state blocks. This pattern was used as a demonstration. In practice, blocks which are preloaded with data are not usually grouped together, and, typically it is not known ahead of time which blocks will be used for the preloaded data. In particular, the memory chip manufacture typically provides a memory chip to another party which preloads data and assembles the chip into a final electronic device, such as a cell phone or camera. The chip manufacturer does not know exactly how the chip will be used.

Regarding the mechanism for Vth shifting, it is believed that groups of erased blocks create a channel which allows charges to move and affect user data. The programmed storage elements have highly positive states which can attract mobile electrons that move in the circuitry. The high temperatures of a surface mounting process cause the electrons to be channeled by these groups of erased blocks so that they affect the user data. User data near erased blocks is most affected.

Generally, a worst case shift in Vth occurs for one or more programmed blocks surrounded by a number of erased blocks. Typically, the presence of more than four erased blocks together can affect user data. The worst case is to have one programmed block surrounded by erased blocks on both sides in the same plane. A plane refers to a well in a memory chip. In some cases, more than one plane is used in a chip. Moreover, the problem will be worse for smaller, more scaled, devices since the blocks will be closer together.

FIG. 3a also depicts three read reference voltages, Vra, Vrb and Vrc, which are used for reading data from storage elements. By testing whether the threshold voltage of a given storage element is above or below each read level, the system can determine the state, e.g., programming condition, the storage element is in. Three verify reference voltages, Vva, Vvb and Vvc, are also provided. When programming storage elements to state A, B or C, the system will test whether those storage elements have a threshold voltage greater than or equal to Vva, Vvb or Vvc, respectively.

The problem of altered Vth distributions can occur in a single die package or on multiple stacked dice packages. In particular, the threshold voltage (Vth) distribution shift of a block is strongly dependent on the data state of multiple neighboring blocks. Blocks near multiple erased blocks showed a higher Vth distribution shift, believed to be caused by a global charge effect phenomenon. Shifting of the threshold voltage distribution of the A and B state storage elements was relatively minor compared to the shifting of the C state. This failure mode represents significant data retention issues for preloaded content, e.g., data which is loaded into the memory device prior to surface mounting. In many devices, the firmware architecture leaves all unused blocks in an erased state, which is the worst case for data retention failures during surface mounting. To overcome the Vth shift issue described above, the blocks which would otherwise be in an erased state on the memory device should be programmed to higher Vth levels prior to surface mounting. One possible approach is to program all or nearly all of the storage elements in each unused block. Another possible approach is to program some of the storage elements in a block in a pattern so that the remaining erased blocks are arranged in such a way that their effect on the preloaded data is minimized. This alignment is dependent on the memory technology and the firmware architecture, but may include: filling of all erased blocks, intelligent padding of the user data area, reducing the number of update blocks, control block position alignments, random update block selection, or others.

A straightforward and easily implemented solution is to temporarily raise the threshold voltages of storage elements in the erased blocks from an initial level such as the erase state level to higher levels before the surface mounting process. The higher levels can be at or near the highest data state, e.g., the state of highest potential. After heating occurs in the surface mounting process, and the device is cooled, the blocks whose threshold voltages were temporarily raised can be erased to allow normal operation. Because this solution operates at the physical level, it will work for all current technologies and firmware architectures, and is independent with regard to the formatting and the amount of content loaded to the memory device.

Figure 4A:
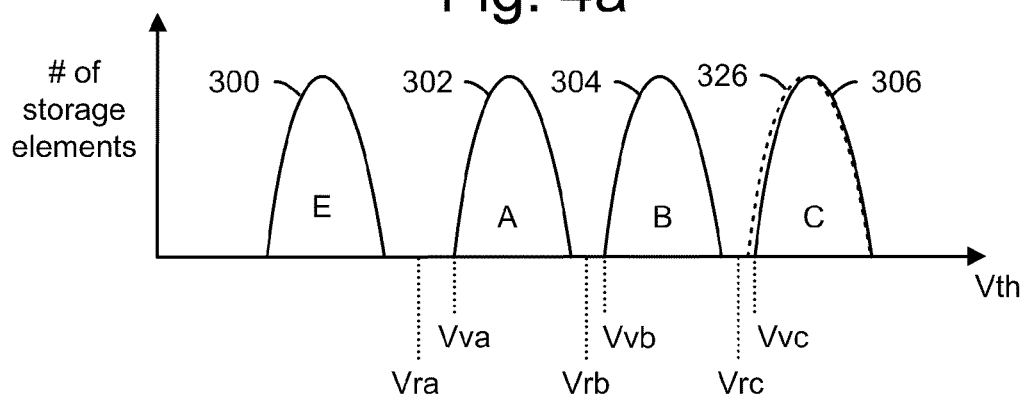
FIG. 4*a* depicts an example set of threshold voltage distributions for a set of four-state blocks of storage elements surrounded by programmed blocks of storage elements in the pattern of FIG. 4*b*.
Figure 4B:
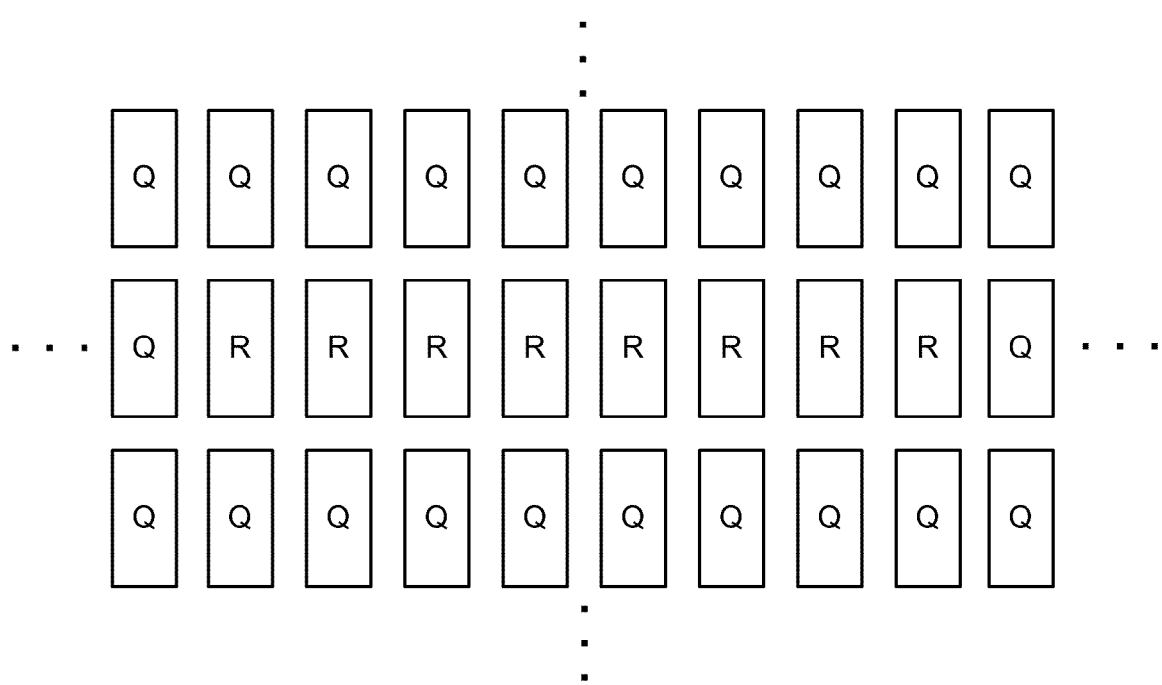
FIG. 4*b* depicts a pattern of randomly programmed blocks surround by quincunx (Q) pattern programmed blocks.
Figure 4C:
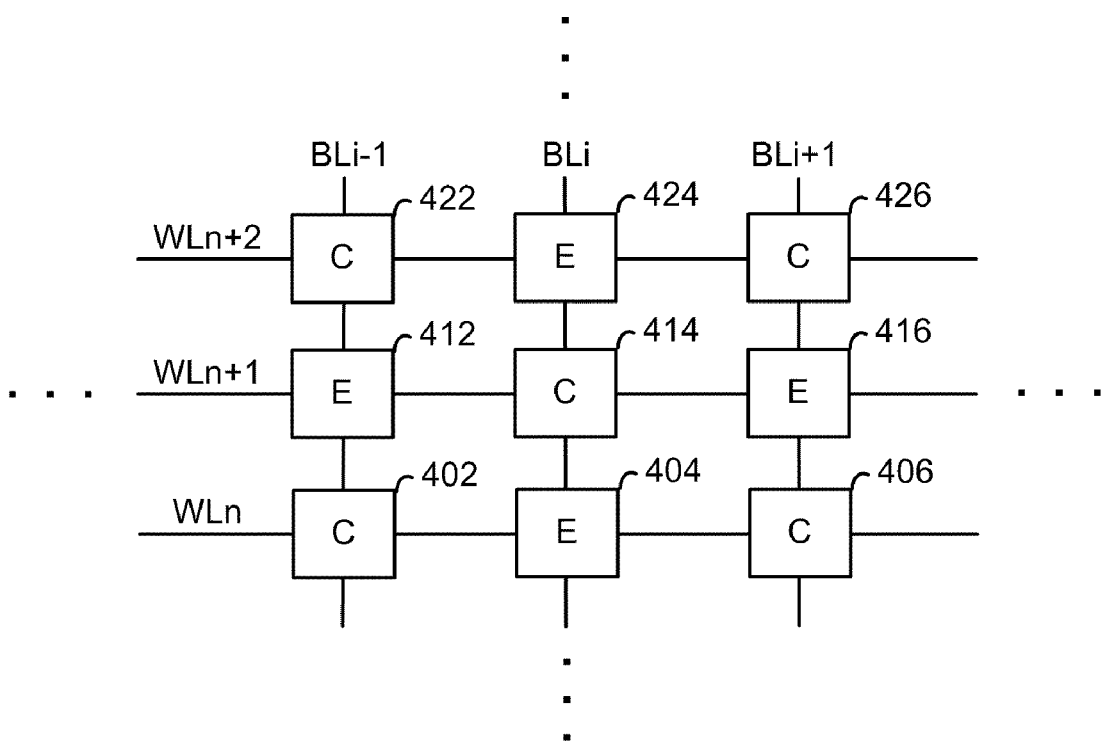
FIG. 4*c* depicts further details of a quincunx (Q) block in the pattern of FIG. 4*b*.

FIG. 4a depicts an example set of threshold voltage distributions for a set of four-state blocks of storage elements surrounded by programmed blocks of storage elements in the pattern of FIG. 4b. Here, the distribution 326 represents a much smaller shifting of the threshold voltage for randomly programmed blocks surrounded by programmed blocks. In particular, the distribution represents eight blocks with a random (R) pattern which were surrounded by 248 blocks which were programmed in a quincunx (Q) or checkerboard pattern as depicted in FIG. 4c. FIG. 4b depicts a pattern of randomly programmed blocks surround by quincunx (Q) pattern programmed blocks.

FIG. 4c depicts further details of a quincunx (Q) block in the pattern of FIG. 4b. A quincunx has five points or units. Each unit can have one or more storage elements. The components depicted may be a subset of a much larger set of storage elements, word lines and bit lines. An nth word line WLn includes example storage elements 402, 404 and 406, an n+1st word line WLn+1 includes example storage elements 412, 414 and 416, and an n+2$^{nd}$ word line WLn+2 includes example storage elements 422, 424 and 426. Example bit lines are represented by BLi−1, BLi and BLi+1. In one possible quincunx pattern, storage elements 402, 406, 414, 422 and 426 are programmed to the C state, and storage elements 404, 412, 416 and 424 remain in the erased state.

Figure 5A:
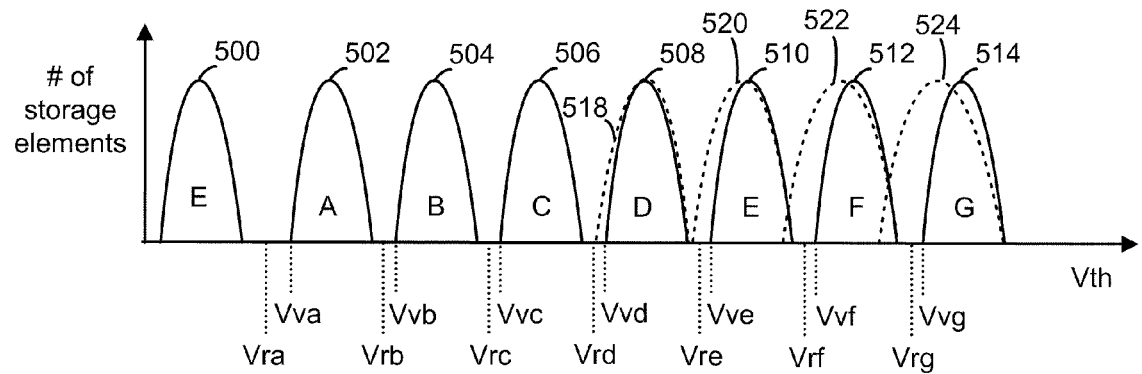
FIG. 5*a* depicts an example set of threshold voltage distributions for a set of eight-state blocks of storage elements surrounded by erased blocks of storage elements in the pattern of FIG. 3*b*.

FIG. 5a depicts an example set of threshold voltage distributions for a set of eight-state blocks of storage elements surrounded by erased blocks of storage elements in the pattern of FIG. 3b. An eight-state or eight-level memory device may store three bits of data per state in eight data states referred to as an erased or E state, represented by distribution 500, and programmed states A, B, C, D, E, F and G, represented by distributions 502, 504, 506, 508, 510, 512 and 514, respectively. It is believed that data retention of higher data states, such as the D-G states, is sensitive to the data pattern inside a memory device during the high temperatures seen during the surface mount process. For example, the D, E, F and G state distributions 508, 510, 512 and 514, respectively, can transition to representative widened distribution 518, 520, 522 and 524, respectively. In some case, corrupted data results. Shifting of the lower states is generally not significant. Here, worst case results are expected due to the surrounding of the programmed blocks by erased blocks. Note that a similar problem is expected with storage elements which store more than eight states of data.

FIG. 5a also depicts seven read reference voltages, Vra, Vrb, Vrc, Vrd, Vre, Vrf and Vrg, which are used for reading data from storage elements. By testing whether the threshold voltage of a given storage element is above or below each read level, the system can determine the state, e.g., programming condition, the storage element is in. Seven verify reference voltages, Vva, Vvb, Vvc, Vvd, Vve, Vvf and Vvg are also provided. When programming storage elements to state A, B, C, D, E, F or G, the system will test whether those storage elements have a threshold voltage greater than or equal to Vva, Vvb, Vvc, Vvd, Vve, Vvf and Vvg, respectively.

Figure 5B:
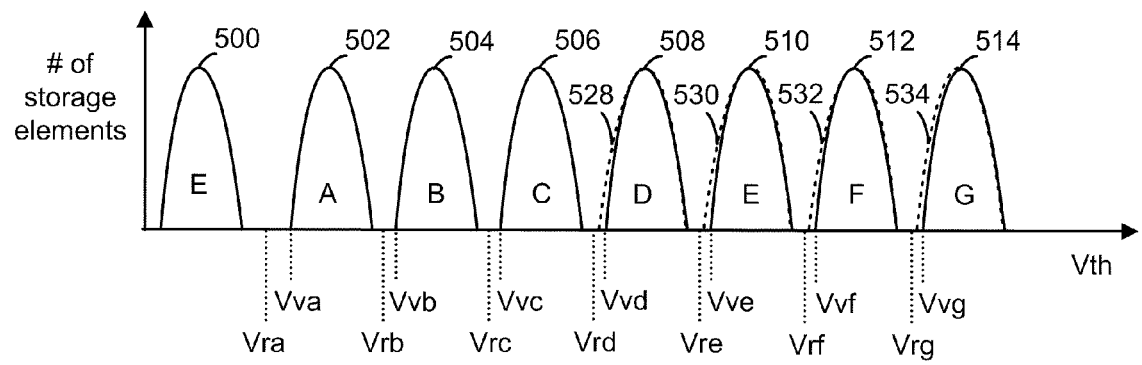
FIG. 5*b* depicts an example set of threshold voltage distributions for a set of eight-state blocks of storage elements surrounded by programmed blocks of storage elements in the pattern of FIG. 4*b*.

FIG. 5b depicts an example set of threshold voltage distributions for a set of eight-state blocks of storage elements surrounded by programmed blocks of storage elements in the pattern of FIG. 4b. Here, the distributions 528, 530, 532 and 534 represent a much smaller shifting of the threshold voltage for randomly programmed blocks surrounded by programmed blocks, compared to FIG. 5a. In particular, the distribution is expected to represent eight blocks with a random (R) pattern which were surrounded by 248 blocks which are programmed in a quincunx (Q) or checkerboard pattern as depicted in FIGS. 4b and 4c. As mentioned, the higher states are most affected by a Vth shift.

Figure 6:
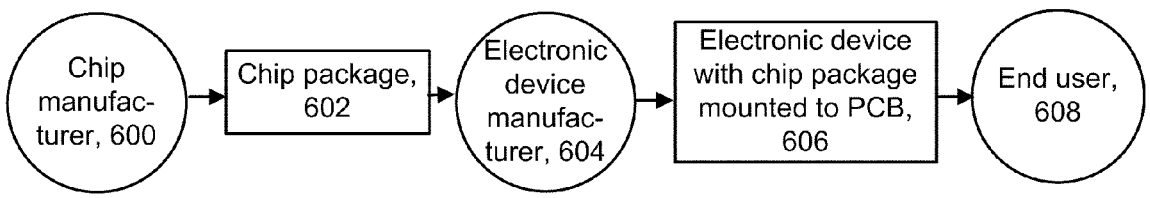
FIG. 6 depicts an overview of an example manufacturing process.

FIG. 6 depicts an overview of an example manufacturing process. A non-volatile memory chip manufacturer 600 provides a chip package 602 which is ready to be surface mounted to a substrate by another party such as an electronic device manufacturer 604. Typically, the chip manufacturer loads in firmware which is used to control the chip, to one or more blocks of the chip. For example, the firmware may include a map or other record which gives the status of all the blocks on the chip: either programmed or erased. The firmware can indicate whether the die or a block in the die is programmed or erased. The firmware can include file system data and other firmware structures. The electronic device manufacturer, such as a cell phone or digital camera manufacturer, uses the chip package by mounting it to a substrate such as a printed circuit board (PCB) or a leader frame, and the substrate is incorporated into an electronic device. The final electronic device 606 with the chip package mounted to the PCB, for instance, is then provided to an end user 608, such as a consumer. Alternatively, the electronic device 606 may be provided to another party for further assembly.

The electronic device manufacture loads content, also referred to as data or software, into the memory chip, usually before the chip is mounted. The surface mounting process typically involves heating the PCB with the chip positioned on it, in a solder reflow process. For example, a ball grid array technique may be used in which the chip package has one face with solder balls in a grid pattern. These balls are used to conduct electrical signals from the integrated circuit to the PCB on which it is placed. The PCB carries copper pads in a pattern that matches the solder balls. The assembly is then heated, either in a reflow oven or by an infrared heater, causing the solder balls to melt. Surface tension causes the molten solder to hold the package in alignment with the circuit board, at the correct separation distance, while the solder cools and solidifies.

Another possible approach involves applying solder paste to specific locations on the PCB, positioning the chip on the solder paste deposits which will hold them in place on the board, and performing a solder reflow, which is a high-temperature process that melts the solder paste so that it can form the final solder connection between the chip and the PCB.

A solder reflow process uses a solder reflow oven, which exposes the board assembly to the necessary temperature profile by heating an environment into which the board assembly, including the chip package, is placed. For example, infrared (IR) Reflow and convection reflow, which are not necessarily exclusive of each other, can be used. Many modern ovens utilize both techniques. IR reflow involves the transfer of thermal energy from infrared lamps to the board assembly. The board assembly is heated by IR reflow primarily by line-of-sight surface heat absorption. Convection reflow transfers heat to the board assembly by blowing heated air around it. Another solder reflow technique is vapor phase reflow, which transfers heat to the board assembly by boiling inert fluorocarbon liquid and enveloping the board with its resulting vapors. A solder reflow process follows an optimized temperature profile to prevent the board from experiencing high thermal stresses while it is undergoing reflow. A temperature of about 260 C may be reached. Moreover, more than one reflow process can be performed. For example, device manufactures often have double-sided boards, in which case they will position components on one side of the board, perform a reflow to mount those components, flip the board over to position components on the opposite side of the board, and perform another reflow process to mount those components.

Figure 7A:
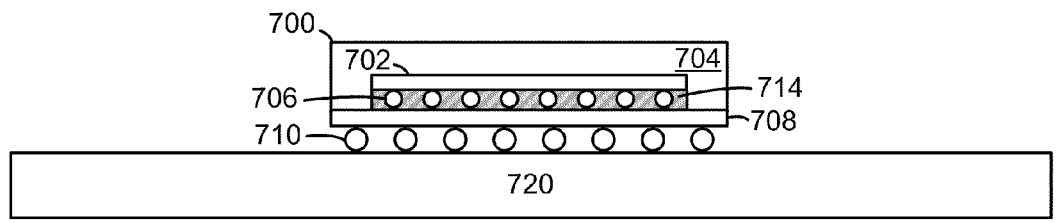
FIG. 7*a* depicts a flip chip package which is surface mounted to a substrate using a solder reflow process.

FIG. 7a depicts a flip chip package 700 which is surface mounted to a substrate using a solder reflow process. Various types of non-volatile memory chip packages are in use. One approach involves a flip chip in which a chip is connected to external circuitry with solder bumps that have been deposited onto chip pads. The solder bumps are deposited on the chip pads on the top side of the wafer during the final wafer processing step. To mount the chip to external circuitry (e.g., a circuit board or another chip or wafer), it is flipped over so that its top side faces down, and aligned so that its pads align with matching pads on the external circuit, and then the solder is flowed to complete the interconnect. This is in contrast to wire bonding, another approach which can be used, in which the chip is mounted upright and wires are used to interconnect the chip pads to external circuitry.

In this example, a chip package 700 includes a die 702 on which the non-volatile memory blocks are formed (see, e.g., die 198 in FIG. 1). The die is mounted on an interposer substrate 708 using solder bumps 706. An under fill material 714, such as electrically-insulating adhesive, is provided between the die 702 and the interposer substrate 708. A plastic encapsulant or mold 704 surrounds and protects the die 702. Beneath the chip package 700, solder balls 710 are used to surface mount the chip package to a substrate 720 such as a PCB or leader frame. A PCB includes a wiring layer which is electrically connected to the die 702 using vias, not shown.

A leader frame, usually made of copper, can be used to connect an integrated circuit chip to outside circuitry. Typically, the chip is attached to a bonding pad of a lead frame. Once the chip is attached, wires are bonded to input/output pads of the integrated circuit and to internal leads of the lead frame. This arrangement of a chip, a lead frame, and bonding wires is then encapsulated in a plastic casing leaving external leads of the lead frame exposed (outside of the plastic casing). The packaged integrated circuit can then be connected to other electronic components on a conventional circuit board by its external leads.

Figure 7B:
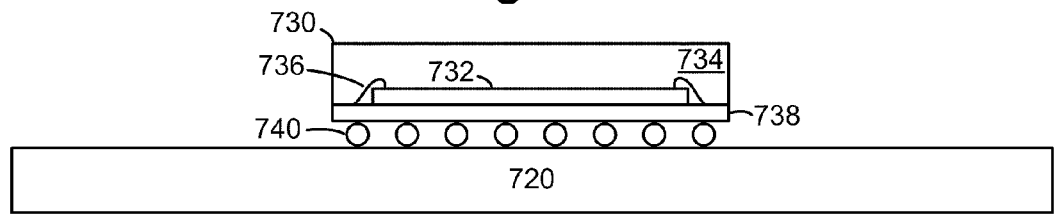
FIG. 7*b* depicts a single die package which is surface mounted to a substrate using a solder reflow process.

FIG. 7b depicts a single die package 730 which is surface mounted to a substrate using a solder reflow process. In another example, a die 732 is mounted to an interposer substrate 738 such as by using an adhesive epoxy tape or film. The die is then wirebonded to the interposer substrate 738 using gold or aluminum wires 736, and a plastic encapsulation 734 is used to protect the die and wires. The chip package 730 is attached to the substrate 720.

Figure 7C:
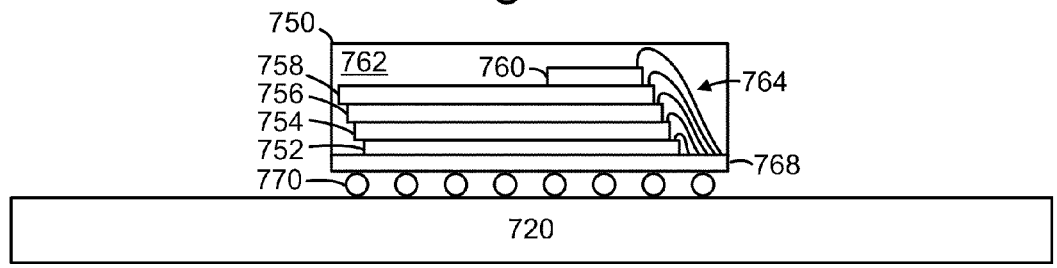
FIG. 7*c* depicts a multiple die package which is surface mounted to a substrate using a solder reflow process.

FIG. 7c depicts a multiple die package 750 which is surface mounted to a substrate using a solder reflow process. In this example, die 752 is attached to an interposer substrate 768, die 754 is attached to die 752, die 756 is attached to die 754 and die 758 is attached to die 756. A controller chip 760 may be provided to control input and output of the die 752-758. Wire bonding wires 764 are provided, along with a plastic encapsulation 762. The chip package 750 is attached to the substrate 720.

A stacked die configuration presents challenges such as the need to keep the stack thermally and mechanically stable on the interposer substrate, while keeping the resulting package as thin as possible. To this end, wafer thinning is commonly used. Wafer thinning involves wafer back grinding followed by a polishing step that relieves stresses imparted by the back grind process to the wafer. Wafers intended for die stacking can be thinned to about 3-6 mils, for instance depending on the use and the wafer size. This technique can also be used for single die packages as well. It is believed that after wafer back grinding is performed, gettering sites are created that can trap charges. However, after polishing, when the bottom of the chip is very smooth, the gettering sites are removed so that charges can move more easily into the floating gates of the non-volatile storage elements of the chip, causing Vth shifts as discussed.

The above chip package configurations and mounting schemes are examples only, as variations are possible. Regarding the use of a solder reflow process, this process has been associated with a problematic shift in Vth, a described previously. However, any process which applies a high temperature to a memory chip in connection with mounting the chip, or for other reasons related to the assembly of an electronic device after data has been loaded in the chip, would likely cause a similar problem, and the solutions provided herein would app to those situations as well.

Figure 8:
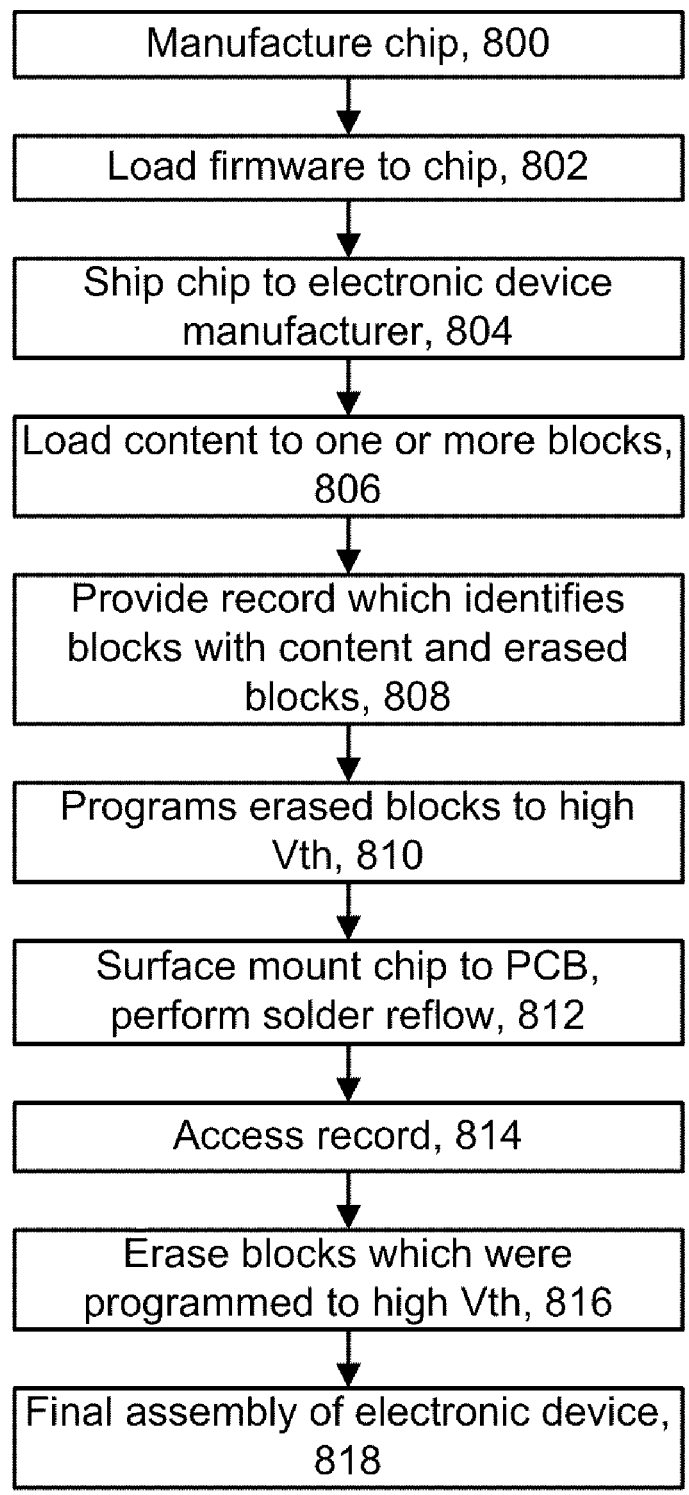
FIG. 8 depicts details of an example manufacturing process.

FIG. 8 depicts details of an example manufacturing process. At step 800, a chip with blocks of non-volatile storage elements is manufactured. See, e.g., FIG. 1. At step 802, firmware is loaded into the chip by the chip manufacturer. As mentioned, the firmware can indicate which blocks have data in them. Blocks which have been determined to be defective and therefore not usable can also be marked. The bad blocks are marked out at a final test and they are not used in production. No data is written to them and they are typically programmed to the B state, for a four level chip, because of the sensitivity to erased blocks during IR reflow.

The remaining blocks, which are not defective and not used for firmware, are in an erased state. At step 804, the chip package is shipped to the electronic device manufacturer, in one possible scenario. It is also possible for the chip manufacturer and the electronic device manufacturer to be the same party. However, due to the high cost of manufacturing chips, it is more common that a small number of chip manufacturers ship chips to a larger number of electronic device manufacturers. At step 806, the electronic device manufacturer loads in content to one or more blocks of the chip. This referred to a preloaded content because it is loaded in before the surface mounting of the chip.

As an example, for an electronic device such as a GPS device, the content which is loaded may include map data. For an automotive application, the content may be used for controlling an electronic system of a particular automobile. For a cell phone, the preloaded content could be the software image of an operating system such as MICROSOFT WINDOWS®. Typically, the electronic device manufacturer can load its data quickly through a USB system using a duplication system in which several chips are loaded in parallel.

At step 808, a record is provided by the firmware which identifies the blocks which have the preloaded content and the blocks which are still in the erased state. Generally, the chip manufacturer does not know ahead of time which blocks will be used to store the content of the electronic device manufacturer, as it depends on the amount of data and how the data is programmed. However, the firmware can maintain an appropriate record of which blocks have programmed data and which blocks are still erased, as mentioned, and update this record as additional content is loaded.

Figure 9A:
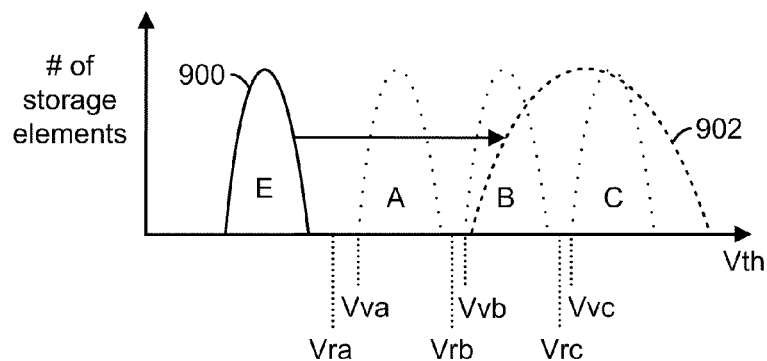
FIG. 9*a* depicts threshold voltage distributions in an erased block of a four-state memory device in which the threshold voltage of erased storage elements is raised in preparation for a surface mounting process.

At step 810, the blocks which are erased are programmed to a higher threshold voltage. That is, some or all of the non-volatile storage elements in an erased block have their Vth raised from an initial level, such as a level which is associated with the erased state, to one or more higher levels, such as levels which are associated with one or more higher states. For example, FIG. 9a depicts threshold voltage distributions in an erased block of a four-state memory device in which the threshold voltage of erased storage elements is raised in preparation for a surface mounting process. Initially, the erased block is represented by the Vth distribution 900. A programming process is then performed to raise the Vth level of some or all of the storage elements in the block. One possible technique is to apply a single program pulse 920 as depicted in FIG. 9c, e.g., as part of a test mode command. For a selected word line in the block, the program pulse is applied to each storage element which is in communication with the word line. No verify operation need follow the program pulse, as it is sufficient for the Vth to be raised significantly above the erased level, in a wide band of Vth, represented by distribution 902, without all storage elements being raised to a closely-controlled narrow Vth distribution, such as a distribution of a data state. The application of a single program pulse will result in a relatively wide distribution 902 due to an expected variation in the programming speed of different storage elements. Some of the storage elements may reach a Vth which exceeds that of the highest state.

For example, the distribution 902 may extend above the C state, the highest state, and as low as the B state, above Vvb, the second highest of the four states. The duration and magnitude (Vpgm) of the program pulse 920 can be chosen accordingly to achieve the desired Vth distribution. Thus, when at least one block which is preloaded with data uses at least four data states (E, A, B, C) to store the data, the at least four data states include a highest data state (C) which has an associated verify level (Vvc), and a second highest data state (B) which has an associated verify level (Vvb). The higher Vth levels to which the erased storage elements are programmed can be at least as high as the associated verify level (Vvb) of the second highest data state (B), for at least one non-volatile storage element in the at least one block which is not preloaded with data.

Alternatively one or more cycles of a program pulse followed by a verify operation can be used to achieve a closely-controlled narrow Vth distribution, such as a distribution of a data state, e.g., the highest (C) or second highest (B) state. Note that data scrambling, in which the data states are used uniformly, should not be used, so that a C state element, for instance is actually programmed to the highest Vth and not remapped to a lower Vth.

Figure 9B:
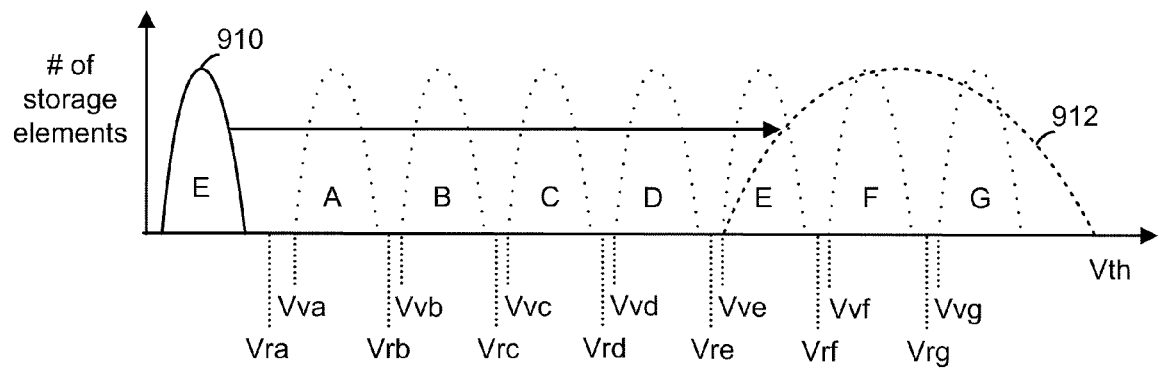
FIG. 9*b* depicts threshold voltage distributions in an erased block of an eight-state memory device in which the threshold voltage of erased storage elements is raised in preparation for a surface mounting process.
Figure 9C:
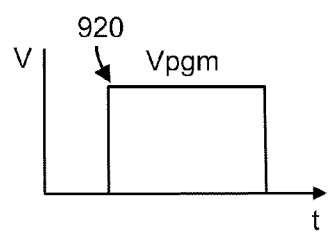
FIG. 9*c* depicts an example program pulse which is applied to erased storage elements to achieve the raised threshold voltage distributions of FIG. 9*a* or 9*b*.

FIG. 9b depicts threshold voltage distributions in an erased block of an eight-state memory device in which the threshold voltage of erased storage elements is raised in preparation for a surface mounting process. The Vth scales in FIGS. 9a and 9b are not necessarily the same. Initially, the erased block is represented by the Vth distribution 910. A programming process is then performed to raise the Vth level of some or all of the storage elements in the block. It is sufficient for the Vth to be raised significantly above the erased level, in a wide band of Vth, represented by distribution 912, without all storage elements being raised to a closely-controlled narrow Vth distribution, such as a distribution of a data state. For example, the distribution 912 may extend above the G state, the highest state, and as low as the E state, above Vve, the third highest of the eight states. Thus, when at least one block which is preloaded with data uses at least eight data states (E, A, B, C, D, E, F and G) to store the data, the at least eight data states include a highest data state (G) which has an associated verify level (Vvg), a second highest data state (F) which has an associated verify level (Vvf), and a third highest data state (E) which has an associated verify level (Vve). The higher Vth levels to which the erased storage elements are programmed can be at least as high as the associated verify level (Vve) of the third highest data state (E), for at least one non-volatile storage element in the at least one block which is not preloaded with data.

Alternatively one or more cycles of a program pulse followed by a verify operation can be used to achieve a closely-controlled narrow Vth distribution, such as a distribution of a data state, e.g., the highest (G), second highest (F) or third highest (E) state.

Referring again to FIG. 8, the programming of the erased blocks in step 810 has been discussed. Step 812 includes surface mounting the chip to a PCB or other substrate and performing a solder reflow process. Step 814, which occurs after the solder reflow process has been completed, includes accessing the record to determine which blocks were programmed in step 810. In step 816, these temporarily programmed blocks are erased to return them to their original, pre-reflow state. Step 818 includes final assembly of the electronic device.

FIG. 9c depicts an example program pulse 920 which is applied to erased storage elements to achieve the raised threshold voltage distributions of FIG. 9a or 9b.

Figure 10:
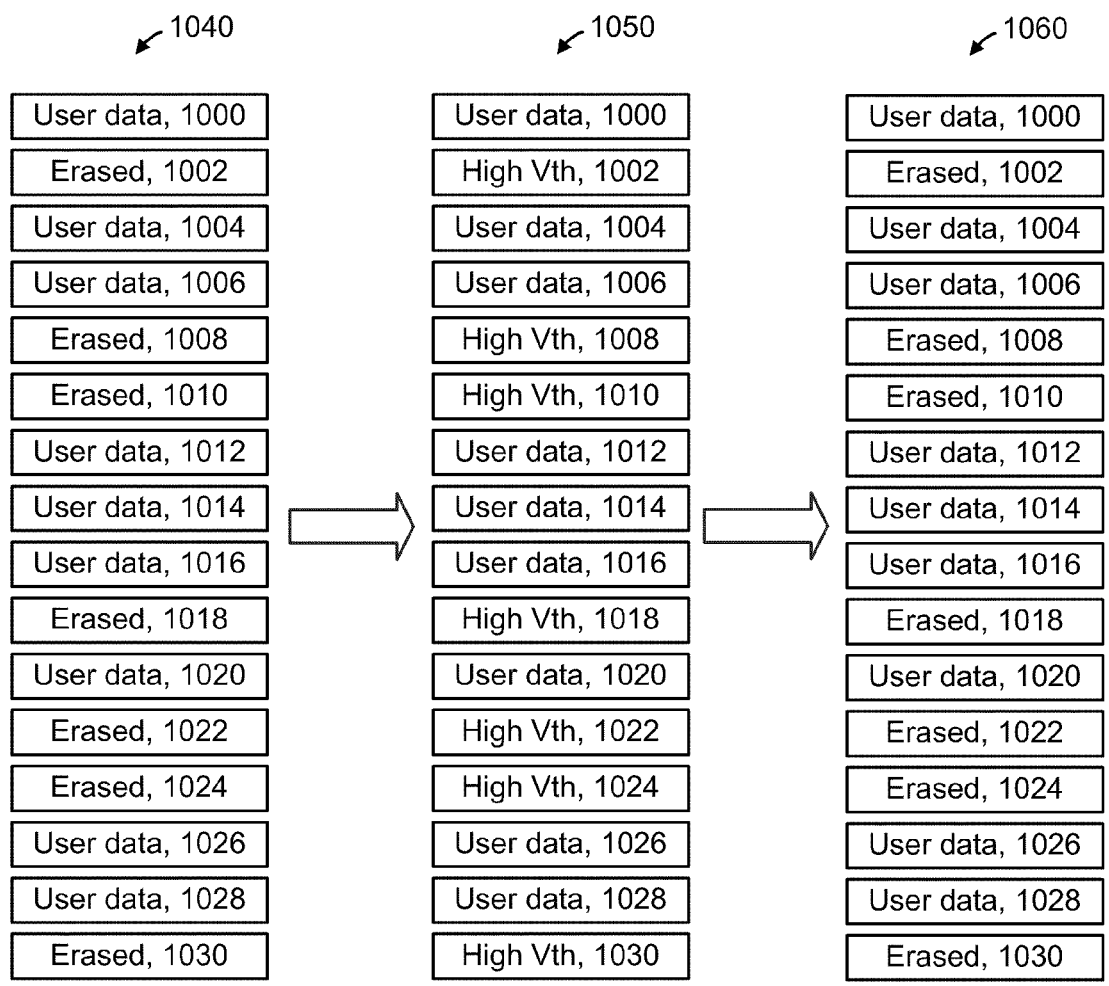
FIG. 10 depicts processing of blocks before and after a surface mounting process.

FIG. 10 depicts processing of blocks before and after a surface mounting process. In this example, a set of sixteen blocks is considered. In an initial configuration 1040, blocks 1000, 1004, 1006, 1012, 1014, 1016, 1020, 1026 and 1028 contain user data, also referred to as preloaded content, and blocks 1002, 1008, 1010, 1018, 1022, 1024 and 1030 remain erased. In a modified configuration 1050, in preparation for the solder reflow, blocks 1002, 1008, 1010, 1018, 1022, 1024 and 1030 are programmed to a high Vth, e.g., distribution 902 in FIG. 9a or 912 in FIG. 9b. In a final configuration 1060, after completion of one or more solder reflow steps, blocks 1002, 1008, 1010, 1018, 1022, 1024 and 1030 are returned to the erased state.

Figure 11:
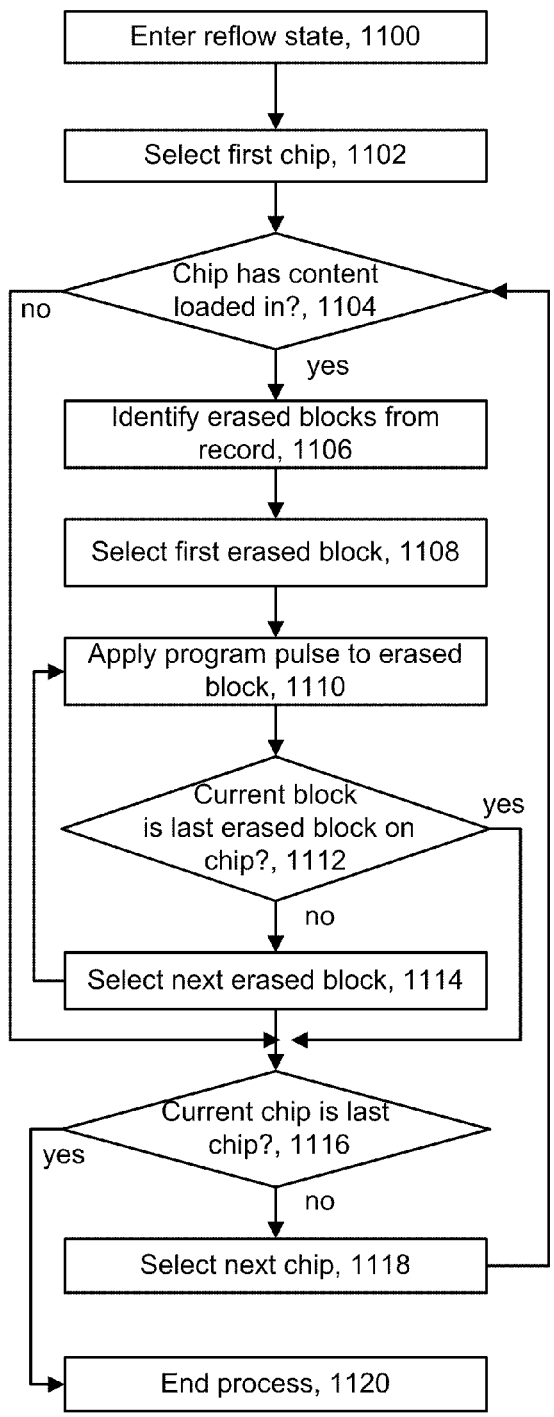
FIG. 11 depicts processing which occurs before a surface mounting process.

FIG. 11 depicts processing which occurs before a surface mounting process. At step 1100 an "enter reflow state" command is received to enter a reflow state. This can include having all erased blocks (e.g., all blocks that are not part of the firmware file system, firmware structures, user data, or marked as bad) programmed to higher Vth levels. The programming should be unscrambled raw data with no ECC to ensure all storage elements are at the correct voltage. In addition, because this effect does not have cross-die influence, only dice with data should be programmed.

Generally, host commands can be issued to both enter and exit the reflow preparation stage. Because this will be a special operation, electronic device manufactures can adjust their timeout scenarios to allow for the completion of these commands. Both commands required for this operation can be implemented as vendor-specific commands that specifically put the parts into this state. In addition, because of the potential for long operation times associated with programming or erasing the necessary blocks, the unit should signal a busy state or return a busy status when polled until the operation is complete.

The host commands can be provided using any suitable technique. One approach is to use diagnostic commands which are specific to the chip manufacturer. Another approach is to use commands which are specific to the electronic device manufacturer. One example is Secure Digital (SD) non-volatile memory card format commands. For example, the SANDISK® iNAND™ eMMC (embedded multimedia card) and eSD (embedded secure digital) families of high capacity Embedded Flash Drives include options to have vendor specific commands. The host command can be provided by a host such as 155 in FIG. 1 which is associated with test equipment of the electronic device manufacturer, for instance.

At step 1102, a first chip is selected, when a multi-chip package is used. At decision step 1104, a determination is made as to whether the chip has content loaded in. For example, a record in firmware may be accessed to make this determination. It is not necessary to raise the Vth of erased block in a chip which has no preloaded content, as the Vth shift which is sought to be avoided for preloaded content in one chip is not believed to be affected by the presence of erased blocks in another chip in the same chip package. This approach saves times, as no further processing is needed for a chip which does not have preloaded content.

Similarly, a single die may have storage elements in more than one plane, where each plane is in a separate well. No processing is needed for a plane which has no content loaded in.

If the chip does not have content loaded in, the process continues at decision step 1116. If the chip does have content loaded in, step 1106 includes identifying the erased blocks of the chip from a record, e.g., in firmware. Step 1108 selects a first erased block in the chip, and step 1110 applies a program pulse to the erased block. Decision step 1112 determines if the current block is the last erased block on the chip. If it is not the last erased block, step 1114 selects the next erased block in the chip, and step 1110 applies a program pulse to the erased block.

If the current block is the last erased block on the chip, at decision step 1112, a determination is made at decision step 1116 as to whether the current chip is the last chip in the chip package. If the current chip is not the last chip, step 1118 selects the next chip and processing proceeds as discussed at decision step 1104. If the current chip is the last chip, the process ends at step 1120. Subsequently, the non-volatile memory chip package is positioned on the substrate and a solder reflow is performed to surface mount the chip package.

Figure 12:
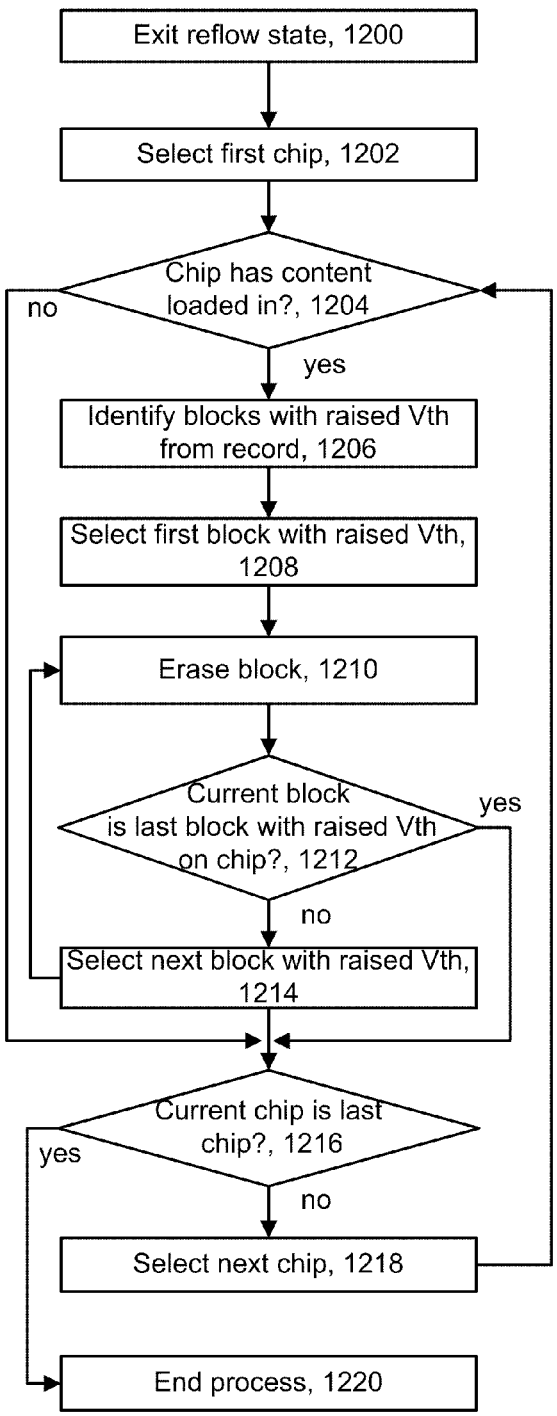
FIG. 12 depicts processing which occurs after a surface mounting process.

FIG. 12 depicts processing which occurs after a surface mounting process. This processing is essentially the reverse of FIG. 11 and involves erasing the blocks which were originally erased. An "exit reflow state" command restores all blocks programmed during the "enter reflow state" command to their original erase state, thus allowing normal unit operation. At step 1200, the "exit reflow state" command is received. At step 1202, a first chip in the chip package is selected. A record is accessed to determine if the chip has content loaded in. If the chip does not have content loaded in, a determination is made at decision step 1216 as to whether the current chip is the last chip. If it is the last chip, the process ends at step 1220. If it is not the last chip, the next chip is selected at step 1218, and processing proceeds at step 1204.

At decision step 1204, if the chip has content loaded in, step 1206 accesses a record to identify blocks with a raised Vth in the chip. Step 1208 selects a first block with a raised Vth, and step 1210 erases the block, thus returning it to its original condition. If the current block is the last block with a raised Vth in the chip, the processing proceeds at decision step 1216. If the current block is not the last block with a raised Vth in the chip, at decision step 1212, the next block in the chip with a raised Vth is selected at step 1214, and the control flow proceeds to step 1210.

In one embodiment of the technology described herein, a method is provided for preparing a non-volatile memory chip package for surface mounting to a substrate in a surface mounting process which heats the non-volatile memory chip package. The non-volatile memory chip package comprises at least one die, and the at least one die comprises a plurality of blocks of non-volatile storage elements. The method includes preloading at least one block of the plurality of blocks with data, identifying at least one block of the plurality of blocks which is not preloaded with data. The method further includes, responsive to the identifying, raising threshold voltages of non-volatile storage elements of the at least one block which is not preloaded with data, from an initial level to higher levels. The method further includes following the raising, performing a surface mounting process which surface mounts the non-volatile memory chip package to the substrate, where the surface mounting process heats an environment into which the non-volatile memory chip package and the substrate are placed.

In another embodiment, at least one processor readable storage device is provided which has processor readable code embodied thereon for programming one or more processors to perform a computer implemented method for preparing a non-volatile memory chip package for surface mounting to a substrate in a surface mounting process which heats the non-volatile memory chip package. The non-volatile memory chip package comprises at least one die, and the at least one die comprises a plurality of blocks of non-volatile storage elements. The method performed includes preloading at least one block of the plurality of blocks with data, identifying at least one block of the plurality of blocks which is not preloaded with data. The method further includes, responsive to the identifying, raising threshold voltages of non-volatile storage elements of the at least one block which is not preloaded with data, from an initial level to higher levels. The method further includes following the raising, performing a surface mounting process which surface mounts the non-volatile memory chip package to the substrate, where the surface mounting process heats an environment into which the non-volatile memory chip package and the substrate are placed.

In another embodiment, a method is provided for preparing a non-volatile memory chip package for surface mounting to a substrate in a surface mounting process which heats the non-volatile memory chip package. The non-volatile memory chip package comprises a plurality of die, and each die comprises a plurality of blocks of non-volatile storage elements. The method includes programming at least one block of at least one die of the plurality of die with data, identifying at least one block of the at least one die which is not programmed with data, and which is in an erased state, identifying at least one other die of the plurality of die which is not programmed with data, and which has blocks in the erased state, and raising threshold voltages of non-volatile storage elements of the at least one block which is not programmed with data above the erased state, where the blocks in the erased state of the at least one other die which is not programmed with data are kept in the erased state.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A method for preparing a non-volatile memory chip package, including preparing the non-volatile memory chip package for surface mounting to a substrate in a surface mounting process which heats the non-volatile memory chip package, the non-volatile memory chip package comprises a die comprising a plurality of blocks of non-volatile storage elements, the method comprising:

preloading a block of the plurality of blocks with data;
identifying a block of the plurality of blocks which is not preloaded with data, the block which is not preloaded with data is in an erased state;
responsive to the identifying, raising threshold voltages of non-volatile storage elements of the block which is not preloaded with data, from an initial level which is a level of the erased state, to higher levels; and
following the surface mounting process, erasing the non-volatile storage elements of the block which is not preloaded with data to the erase state.

2. The method of claim 1, further comprising:
placing the non-volatile memory chip package on the substrate after the preloading and the raising.

3. The method of claim 1, wherein:
the block which is preloaded with data uses at least four data states to store the data, the at least four data states includes a highest data state which has an associated verify level, and a second highest data state which has an associated verify level; and
the higher levels are at least as high as the associated verify level of the second highest data state, for a non-volatile storage element in the block which is not preloaded with data.

4. The method of claim 1, wherein:
the block which is preloaded with data uses at least eight data states to store the data, the at least eight data states include a highest data state which has an associated verify level, a second highest data state which has an associated verify level, and a third highest data state which has an associated verify level; and the higher levels are at least as high as the associated verify level of the third highest data state, for a non-volatile storage element in the block which is not preloaded with data.

5. The method of claim 1, wherein:
the substrate is a printed circuit board; and
the surface mounting process comprises a solder reflow process in which the non-volatile memory chip package is soldered to the printed circuit board.

6. The method of claim 1, wherein:
the plurality of blocks of non-volatile storage elements are on a common die.

7. A method for preparing a non-volatile memory chip package, including preparing the non-volatile memory chip package for surface mounting to a substrate in a surface mounting process which heats the non-volatile memory chip package, the non-volatile memory chip package comprises a die comprising a plurality of blocks of non-volatile storage elements, the method comprising:
preloading a block of the plurality of blocks with data;
identifying a block of the plurality of blocks which is not preloaded with data;
responsive to the identifying, raising threshold voltages of non-volatile storage elements of the block which is not preloaded with data, from an initial level to higher levels, the raising the threshold voltages comprises applying a program pulse to the non-volatile storage elements of the block which is not preloaded with data, without performing a verifying operation.

8. A non-transitory processor readable storage device having processor readable code embodied thereon for programming one or more processors to perform a computer implemented method for preparing a non-volatile memory chip package, including preparing the non-volatile memory chip package for surface mounting to a substrate in a surface mounting process which heats the non-volatile memory chip package, the non-volatile memory chip package comprises a die comprising a plurality of blocks of non-volatile storage elements, the method comprising:
preloading a block of the plurality of blocks with data;
identifying a block of the plurality of blocks which is not preloaded with data; and
responsive to the identifying, raising threshold voltages of non-volatile storage elements of the block which is not preloaded with data from an initial level to higher levels, the block which is preloaded with data uses at least four data states to store the data, the at least four data states includes a highest data state which has an associated verify level, and a second highest data state which has an associated verify level, and the higher levels are at least as high as the associated verify level of the second highest data state, for a non-volatile storage element in the block which is not preloaded with data.

9. The non-transitory processor readable storage device of claim 8, wherein the block which is not preloaded with data is in an erased state, and the initial level is a level of the erased state, the method further comprising:
following the surface mounting process, erasing the non-volatile storage elements of the block which is not preloaded with data to the erase state.

10. The non-transitory processor readable storage device of claim 8, wherein:
the block which is preloaded with data uses at least eight data states to store the data, the at least eight data states include a highest data state which has an associated verify level, a second highest data state which has an associated verify level, and a third highest data state which has an associated verify level; and
the higher levels are at least as high as the associated verify level of the third highest data state, for a non-volatile storage element in the block which is not preloaded with data.

11. The non-transitory processor readable storage device of claim 8, wherein:
the raising the threshold voltages comprises applying a program pulse to the non-volatile storage elements of the block which is not preloaded with data, without performing a verifying operation.

12. The non-transitory processor readable storage device of claim 8, wherein:
the non-volatile storage elements whose threshold voltages are raised are provided in a quincunx pattern with other non-volatile storage elements in the block which are not preloaded with data, and whose threshold voltages are not raised.

13. A non-transitory processor readable storage device having processor readable code embodied thereon for programming one or more processors to perform a computer implemented method for preparing a non-volatile memory chip package, including preparing the non-volatile memory chip package for surface mounting to a substrate in a surface mounting process which heats the non-volatile memory chip package, the non-volatile memory chip package comprises a die comprising a plurality of blocks of non-volatile storage elements, the method comprising:
preloading a block of the plurality of blocks with data;
identifying a block of the plurality of blocks which is not preloaded with data; and
responsive to the identifying, raising threshold voltages of non-volatile storage elements of the block which is not preloaded with data from an initial level to higher levels, the non-volatile storage elements whose threshold voltages are raised are provided in a quincunx pattern with other non-volatile storage elements in the block which are not preloaded with data, and whose threshold voltages are not raised.

14. A method for preparing a non-volatile memory chip package, including preparing the non-volatile memory chip package for surface mounting to a substrate in a surface mounting process which heats the non-volatile memory chip package, the non-volatile memory chip package comprises a plurality of die, each die comprises a plurality of blocks of non-volatile storage elements, the method comprising:
programming a block of a die of the plurality of die with data;
identifying a block of the die which is not programmed with data, and which is in an erased state;
identifying another die of the plurality of die which is not programmed with data, and which has blocks in the erased state; and
raising threshold voltages of non-volatile storage elements of the block which is not programmed with data above the erased state, where the blocks in the erased state of the another die which is not programmed with data are kept in the erased state.

15. The method of claim 14, further comprising:
following the surface mounting process, erasing the non-volatile storage elements of the block which is not programmed with data, and which has non-volatile storage elements with their threshold voltages raised above the erased state.

16. The method of claim 14, wherein:
the block which is programmed with data uses at least four data states to store the data, the at least four data states include a highest data state which has an associated verify level, and a second highest data state which has an associated verify level; and
the non-volatile storage elements which have their threshold voltages raised above the erased state include a non-volatile storage element which has its threshold voltage raised above the associated verify level of the second highest data state.

17. The method of claim 14, wherein:
the raising the threshold voltages comprises applying a program pulse to the non-volatile storage elements of the block which is not programmed with data, without performing a verifying operation.

18. The method of claim 14, wherein:
the substrate is a printed circuit board; and
the surface mounting process comprises a solder reflow process in which the non-volatile memory chip package is soldered to the printed circuit board.

* * * * *